(12) United States Patent
Howe

(10) Patent No.: US 11,881,849 B2
(45) Date of Patent: Jan. 23, 2024

(54) SOLID STATE RELAY HARVESTING POWER FROM LOAD BY MEASURING STORED ENERGY

(71) Applicant: Littelfuse, Inc., Chicago, IL (US)

(72) Inventor: Bret R. Howe, Irvine, CA (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 17/735,639

(22) Filed: May 3, 2022

(65) Prior Publication Data
US 2023/0361770 A1 Nov. 9, 2023

(51) Int. Cl.
| | | |
|---|---|---|
| H03K 17/687 | (2006.01) | |
| H01H 47/00 | (2006.01) | |
| H02H 3/08 | (2006.01) | |
| H02H 3/10 | (2006.01) | |
| H02H 3/20 | (2006.01) | |
| H03K 17/06 | (2006.01) | |
| H03K 19/20 | (2006.01) | |

(52) U.S. Cl.
CPC ......... *H03K 17/687* (2013.01); *H03K 17/063* (2013.01); *H03K 19/20* (2013.01); *H03K 2217/0081* (2013.01)

(58) Field of Classification Search
None
See application file for complete search history.

(56) References Cited

U.S. PATENT DOCUMENTS

| | | | | |
|---|---|---|---|---|
| 10,488,904 B2 * | 11/2019 | Sato | ...... | H01L 31/053 |
| 2010/0270982 A1 | 10/2010 | Hausman, Jr. | | |
| 2019/0067930 A1 * | 2/2019 | Male | ...... | H02H 3/093 |

OTHER PUBLICATIONS

European Search Report and Written Opinion for the European Application No. EP23170739, dated Oct. 2, 2023, 9 pages.

* cited by examiner

*Primary Examiner* — Kenneth B Wells
(74) *Attorney, Agent, or Firm* — KDW Firm PLLC

(57) ABSTRACT

A relay circuit may include a solid state relay switch, coupled to an external voltage line and to an charging capacitor; and a solid state relay control circuit, coupled between the charging capacitor and the solid state relay switch. The solid state relay control circuit may be arranged to: turn the solid state relay switch to an OFF state when a capacitor voltage of the charging capacitor falls below a low threshold value; and change the solid state relay switch from the OFF state to an ON state when the capacitor voltage increases above a high threshold value.

8 Claims, 5 Drawing Sheets

SOLID STATE RELAY HARVESTING POWER FROM LOAD BY MEASURING STORED ENERGY

BACKGROUND

Field

Embodiments relate to the field solid state relays, and more particularly to relay circuits that are chargeable when a relay is in an off state.

Discussion of Related Art

Relays, including solid state relays (SSR) are switches that may be electrically operated. Such relays may operate in power control circuits designed where it is necessary to control a circuit by an independent low-power signal, for example. As such, a power control circuit including a relay may itself derive power from a source, such as a battery. For convenience, power control circuits have been designed that derive power for the relay from a load that is externally coupled to the relay.

One known approach to a load-powered relay is to charge a supply capacitor in the power control circuit to a DC voltage using the load voltage when the relay is off. In this known approach, when the relay is turned on and the capacitor drops to a low level, the relay is automatically turned off for a fixed amount of time to enable the capacitor to recharge. One concern for switching off the capacitor for a fixed time is that the time required for charging the capacitor may not always be well known. For example, the time required to charge the supply capacitor may depend upon, among other factors: 1) The load inductance; 2) The size of the capacitor; 3) The amount of current flowing in the inductor at the time the relay is turned off; 4) Load series resistance; and 5) The amount of load current being taken from the capacitor.

Thus, turning off a relay for a fixed time may result under some circumstances in turning off the relay for too little time, in which case the capacitor does not charge completely; where turning off the relay for too much time will result in the load being disconnected for more time than necessary.

With respect to this and other considerations the present disclosure is provided.

BRIEF SUMMARY

In one embodiment, a relay circuit is provided. The relay circuit may include a solid state relay switch, coupled to an external voltage line and to a charging capacitor. The relay circuit may also include a solid state relay control circuit, coupled between the charging capacitor and the solid state relay switch. The solid state relay control circuit may be arranged to turn the solid state relay switch to an OFF state when a capacitor voltage of the charging capacitor falls below a low threshold value, and may further be arranged to change the solid state relay switch from the OFF state to an ON state when the capacitor voltage increases above a high threshold value.

In another embodiment, a method is provided. The method may include coupling a first end and a second end of a solid state relay switch to a charging capacitor, via a first diode and a second diode. The method may include receiving at the solid state relay switch, an ON control signal based upon an enable HIGH signal generated over an enable line from an external device. The method may further include maintaining the solid state relay switch in an ON state when a switch control voltage is above a preset value, where the switch control voltage is derived from a low threshold for a capacitor voltage of the charging capacitor. The method may also include maintaining the solid state relay switch in an OFF state when the switch control voltage is below the low threshold value.

DESCRIPTION OF EMBODIMENTS

Figure 1A:
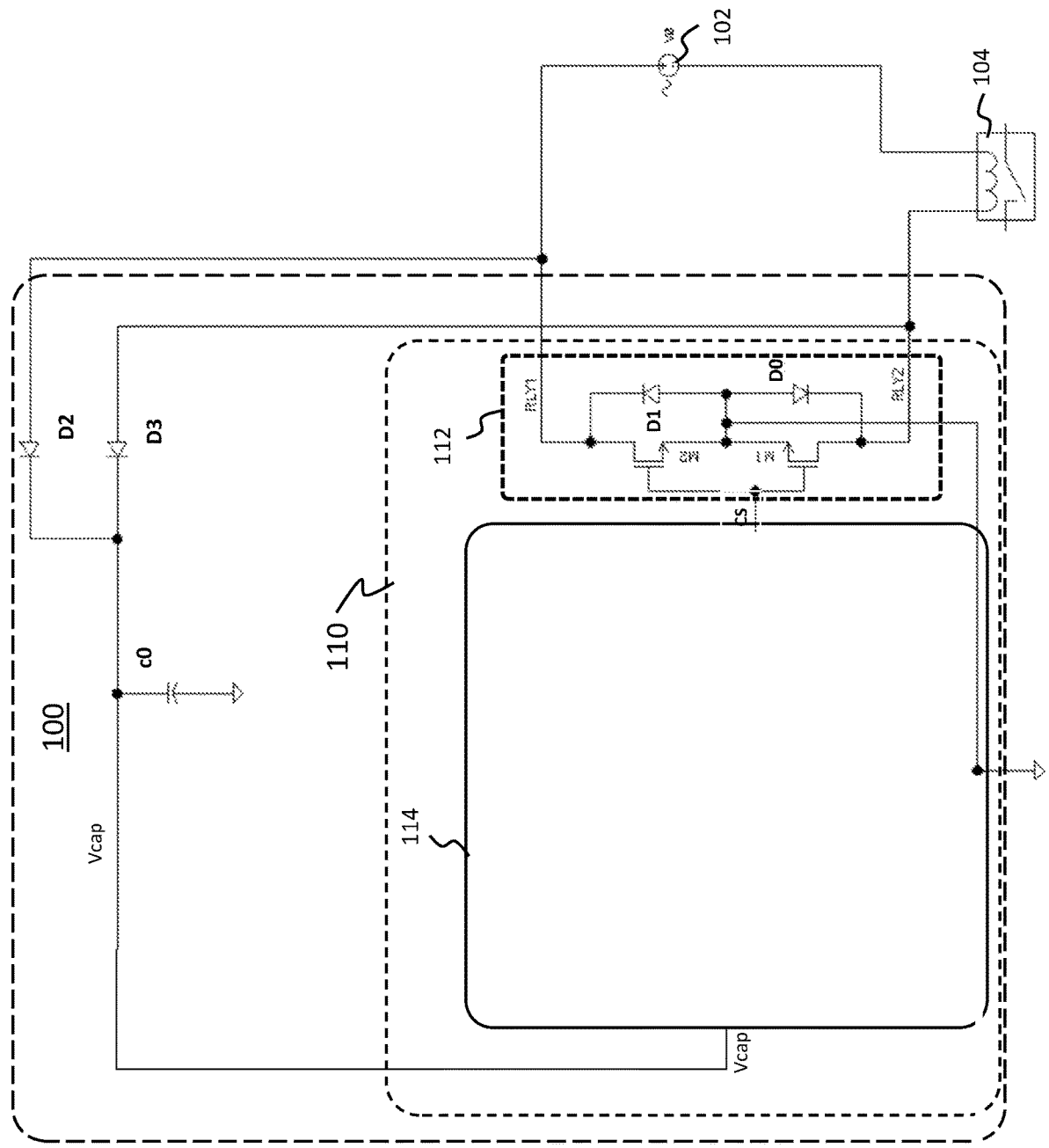
FIG. 1A illustrates one embodiment of a power control circuit.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,","overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

The present embodiments present a novel approach to providing power (harvesting power) in a relay circuit, by monitoring stored energy in a charging capacitor. According to embodiments a relay circuit is provided that optimizes performance by regulating when to draw power from a load for internal power needs. In various embodiments, a solid state relay switch is provided that is coupled to an external voltage line and to an charging capacitor. The solid state relay may use a control circuit to regulate a solid state relay switch so that the solid state relay switch automatically turned off when the voltage of the charging capacitor drops below a threshold value, and is automatically returned to an ON state when the voltage on the charging capacitor increases to reach a high threshold value.

Figure 1B:
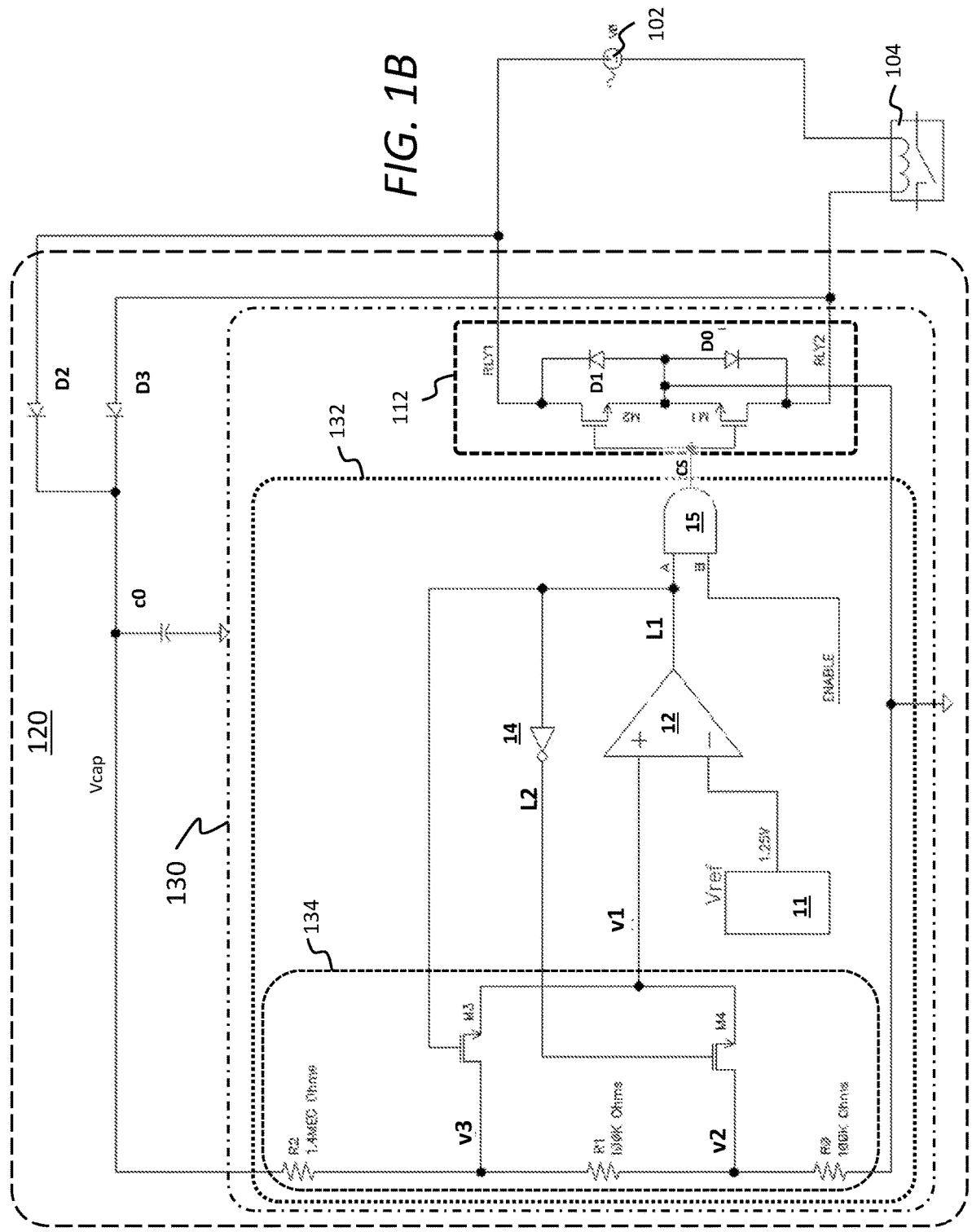
FIG. 1B illustrates another embodiment of a power control circuit.

FIG. 1A, illustrates one embodiment of a power control circuit. In this embodiment of the disclosure, a power control circuit 100 is depicted, in conjunction with an external supply 102, and an external relay, shown as relay 104. In the example shown, a load is formed by the relay 104, which relay is coupled to the external supply 102, which may supply a voltage in the form of an AC source. FIG. 1B illustrates another embodiment of a power control circuit, which circuit may be deemed a variant of the power control circuit 100. Turning in particular to FIG. 1A, in operation, the power control circuit 100 will provide a relay function to enable a solid state relay circuit 110. Applications of the power control circuit 100 include for regulation of power devices such as an air conditioner or heater, which devices may be regulated using a thermostat. In known applications, a thermostat for regulating a heater or air conditioner may be powered by a power source, such as a battery. In the present embodiments, the components of the power control circuit 100 are configured to operate based upon power derived from the external supply 102, via a charging capacitor C0.

As shown in FIG. 1A, the power control circuit 100 includes, in addition to the capacitor C0, a diode D3 and diode D2, and a solid state relay circuit 110, or just "relay circuit". The solid state relay circuit 110 may be embodied in an integrated circuit semiconductor chip in one example. The solid state relay circuit 110 includes a solid state relay, which component is designated as a solid state relay switch 112, and further includes a solid state relay control circuit 114, used to control operation of the solid state relay switch 112.

The details of control of the solid state relay circuit 110 will be discussed with respect to the description to follow, and in particular with respect to the variant in FIG. 1B. In brief, the control of the solid state relay switch 112 will regulate the manner of maintaining sufficient charge in the capacitor C0 while optimizing the amount of time the solid state relay switch 112 is in an OFF state. According to embodiments of the disclosure, a first end of the solid state relay switch 112 is configured to couple to an external load line connected to the external supply 102. The connecting line to couple the first end of the solid state relay switch 112 is shown as RLY1. This line is also coupled to the capacitor C0 via the diode D2. A second end of the solid state relay switch 112 is configured to couple to an external device shown as relay 104, via the line shown as RLY2, which line is also coupled to the capacitor C0 via the diode D3.

In operation, the capacitor C0 is used to power the various components of solid state relay circuit 110. When the solid state relay switch 112 is in an ON state, there will be a relatively lower resistance across the solid state relay switch, resulting in a relatively lower voltage drop between RLY1 and RLY2. In some examples this ON state resistance may be on the order of milliohms, such as 350 mOhms in one non-limiting embodiment. The exact value of the ON state resistance may vary according to particular solid state relay designs. The peak AC current may be 100 mA to 2A in the solid state relay circuit 110 in some embodiments, but may be larger or smaller in other embodiments. As such, the voltage between RLY1 and RLY2 may be substantially lower than the value of voltage that the solid state relay circuit 110 requires to operate. For example, with a peak current of 500 mA and 350 mOhms resistance, these conditions correspond to approximately 0.18 V, which value corresponds to the voltage drop between RLY1 and RLY2. Under these conditions, the voltage level of the capacitor C0 may slowly ramp down accordingly, due to any leakage or load current. As such, in order to preserve sufficient charge or voltage at the capacitor C0, according to the present embodiments, the solid state relay control circuit 114 acts to toggle the solid state relay switch 112 between an ON state and an OFF state based upon the voltage level of the capacitor C0, shown as Vcap. In particular, based upon the level of Vcap, the solid state relay control circuit 114 may send a control signal to the solid state relay switch 112 to alternately turn to an OFF state or turn to an ON state, in a fashion that maintains the solid state relay switch 112 in the ON state for an optimum amount of time while still ensuring that sufficient charge is maintained in the capacitor C0 to operate the solid state relay circuit 110 at all times.

In the example of FIG. 1A, the solid state relay switch 112 is formed of two transistors, shown as a first transistor M1 and a second transistor M2, where the control signal CS is fed to the gates of the first transistor M1 and of the second transistor M2, so as to turn the two transistors into an ON state or into an OFF state in unison. The solid state relay switch 112 is arranged with a common source between the first transistor M1 and the second transistor M2, where the anode of a diode D0 and the anode of a diode D1 are coupled to the common source. Thus, the diode D0 and diode D1 rectify in opposite directions. Because of the rectification performed by diode D0 and diode D1, the common source connection will always be at the lowest voltage in the circuit, and therefore represents the circuit ground reference.

FIG. 1B illustrates another embodiment of a power control circuit 120, operating generally according to the manner of operation of power control circuit 100, with like components labeled the same. In this embodiment, a solid state relay circuit 130 is provided, including a solid state relay control circuit 132, arranged to control operation of the solid state relay switch 112. The solid state relay control circuit 132 includes a specific arrangement of components to both turn the solid state relay switch 112 to an OFF state when Vcap decreases below a low threshold value, and to return the solid state relay switch 112 to an ON state when Vcap increases to reach a high threshold value. However, other arrangements of comparators, logic gates, resistors, diodes, etc. are contemplated in order to perform these functions, as may be appreciated by those of ordinary skill in the art.

As shown in FIG. 1B, the power control circuit 120 includes the capacitor C0, diode D3 and diode D2, discussed above. Together with diode D1 and diode D0, these diodes form a full wave rectifier that allows the capacitor C0 to charge to a voltage corresponding to the positive peak of the AC source, minus one diode voltage drop, and allows the common source to be at a potential corresponding to the negative peak voltage of the AC waveform minus one diode voltage drop.

The solid state relay circuit 130 may be embodied in an integrated circuit semiconductor chip in one example. In operation, the solid state relay switch 112 may be coupled to the external load line, the connecting line RLY1 and the connecting RLY2, as discussed above.

In operation, the capacitor C0 is used to power the various components of solid state relay circuit 130. As with the embodiment of FIG. 1A, the solid state relay control circuit 132 acts to toggle the solid state relay switch 112 between an ON state and an OFF state based upon the voltage level of the capacitor C0, shown as Vcap. In particular, based upon the level of Vcap, the solid state relay control circuit 132 may send a control signal to the solid state relay switch 112 to alternately turn to an OFF state or turn to an ON state, in a fashion that maintains the solid state relay switch 112 in the ON state for an optimum amount of time while still ensuring that sufficient charge is maintained in the capacitor C0 to operate the solid state relay circuit 130 at all times.

To initiate operation of the solid state relay circuit 130, an enabling signal may be provided from an external source to a signal line in the solid state relay control circuit 132. For example, the signal line providing an ENABLE signal may couple to a sensor or other component that provides an ENABLE high signal when activated. Such a component may be a thermal switch of a thermostat that is temperature activated, for example. This signal line will provide an ENABLE high signal to a first input of an AND logic gate 15. For example an enable signal may be received at the AND logic gate 15 from an external circuit that is to turn on a heater whose operation is regulated by the power control circuit 120. The AND logic gate 15 may have a second input to receive a logic signal that is generated from the solid state relay control circuit 132, where this logic signal is shown as L1. In one example, when the AND logic gate 15 outputs a HIGH signal the first transistor M1 and the second transistor M2 will be turned to an ON state. Thus, when the ENABLE signal goes high and is received at input B, and the logic signal L1 goes high and is received at input A, the output of the AND logic gate 15 will turn ON or maintain in an ON state, the solid state relay switch 112.

Said differently, when the logic signal ENABLE is LOW, the output of the AND logic gate 15 (shown as control signal CS) is LOW, so that the control signal CS maintains first transistor M1 and second transistor M2 in an OFF state, and thus, the solid state relay switch 112 in an OFF state. In this state, the capacitor CO will be charged via the diodes D0-D3 to a value represented by the peak voltage V0, provided by the external supply 102 (which load may be an AC source in this embodiment), minus the diode voltage drop. In operation, when RLY1 is positive with respect to RLY2, diode D2 and diode D0 will be turned on when V0 is, in one example, 1.2V greater than Vcap. When RLY2 is positive with respect to RLY1, diode D3 and diode D1 will be turned on when V0 is 1.2V greater than Vcap. An exemplary value according to one non-limiting embodiment for the peak voltage for capacitor C0 is 32V.

Note that the capacitor voltage is shown as Vcap, and is coupled to various components of the solid state relay control circuit 132 via a voltage divider circuit 134. Exemplary values of resistances for resistors, R1, R2, and R3 are shown for the voltage divider circuit 134. These resistors separate the voltage divider circuit 134 into separate voltage stages. The voltage divider circuit 134 is coupled to output a voltage V3 between resistor R2 and resistor R1, and a voltage V2, between resistor R1 and resistor RO. A drain side of a first control switch, shown as transistor M3, is coupled to receive the voltage V3 and a drain side of a second control switch, shown as transistor M4 is coupled to receive the voltage V2. The gate of transistor M3 is controlled by a voltage coupled to the logic line L1, while the gate of transistor M4 is controlled by a voltage coupled to the logic line L2. In turn, the logic line L1 is coupled to L2 via an inverter 14. The sources of the transistors M3 and M4 are coupled via an input line to a first input of a comparator 12. The solid state relay control circuit 132 operates such that when transistor M3 is in an ON state, the voltage V1 on the input line to comparator 12 will be equal to the voltage V3, while when transistor M4 is in an ON state, the voltage V1 on the input line to comparator 12 will be equal to the voltage V2.

The solid state relay control circuit 132 is further provided with a reference voltage (Vref) source 11, arranged to output a fixed voltage to a second input of the comparator 12. In this manner, the comparator 12 will output a logic level L1 as high when the value of V1 is greater than the value of Vref.

Moreover, when the ENABLE signal is low, and Vcap is charged at a high value, the solid state relay control circuit 132 is arranged such that the values of the voltages V2 and V3 will be larger than the reference voltage Vref. In one example, Vref=1.25 V, while V2=2V and V3=4 V when Vcap has a value of 32 V. Because of this circumstance, logic level L1 will be high, enabling transistor M3. After L1 is inverted through inverter 14, the logic level L2 will be LOW, turning off transistor M4. In this circumstance the value of V1 will equal V3.

Under the above condition with logic level L1 HIGH, when an enable signal is received from an external source, that is, when the ENABLE signal received at input B of AND logic gate 15 goes HIGH, the control signal CS is output from the AND logic gate 15 to enable transistor M1 and transistor M2 of solid state relay switch 112. Thus, when the power control circuit 120 is initially enabled, the solid state relay switch 112 may switch from an OFF state to an ON state. Note that in the ON state of solid state relay switch 112 the voltage across RLY1 and RLY2 will be reduced close to zero, such as several millivolts.

The solid state relay control circuit 132 acts to ensure that the solid state relay switch 112 remains ON just for necessary time to maintain the capacitor C0 at an appropriate voltage level in the following manner. When the solid state relay switch 112 is enabled to an ON state with the capacitor voltage at a high voltage level, the capacitor C0 will provide sufficient energy to power the internal components of solid state relay circuit 130. Note the level of voltage which may be deemed to constitute a high voltage level for operating a charging capacitor may be set empirically according to the relay to be protected, but may lie in the range of 30 V or so according to some non-limiting embodiments. While the solid state relay switch 112 remains ON, the value of Vcap will slowly ramp down due to any load current and leakage current present. As the value of Vcap falls, the value of V3 output from the voltage divider circuit 134 will reduce in proportion. When the value of V3 falls below a threshold value set by the solid state relay control circuit 132, in this case below Vref (meaning less than 1.25 V for the specific example shown), the resultant value of V1 (the same as V3 at this stage) will cause the comparator 12 to output logic LOW on L1. Note that depending on the exact resistance value of the resistors in the voltage divider circuit 134, this value of V3 may correspond to a desired or targeted low threshold value for Vcap, such as 10 V. The logic LOW signal on L1 will then be fed to the gate of transistor M3, turning off transistor M3. At the same time the logic LOW signal on L1 will be received at the input A of AND logic gate 15, causing the control signal CS to go LOW, turning off the transistors M1 and M2 of the solid state relay switch 112, thus placing the solid state relay switch in the OFF state.

At the same time as the solid state relay switch 112 is turned off, the logic LOW on L1, passing through inverter 14, will output a logic HIGH signal to the gate of transistor M4, turning on transistor M4, such that the value of voltage V2 is now the same as the value of voltage V1. Following the example above, the value of V1 (and V2) at this time will be approximately 0.63 V, well below a value sufficient to cause comparator 12 to output a logic HIGH signal on L1. Under these conditions, the control signal CS that is output from AND logic gate 15 will remain logic LOW, maintaining transistor M1 and transistor M2 off. As such, the voltage between RLY1 and RLY2 will now be represented by the voltage V0 of external supply 102, thereby resulting in charging of the capacitor C0.

When the voltage on capacitor C0, Vcap, reaches a high threshold value, such as 20 V, this increase in voltage will be sufficient to increase the voltage V2 in the voltage divider circuit 134, and thus the voltage V1, to equal or exceed the fixed value of Vref, fed to the comparator 12, such as 1.25V in the present example. At this latter instance, the comparator 12 will output logic high on L1, thus enabling the transistors M1, M2, and M3. As a result, the voltage V1 will be reset to equal the current value of V3, such as 2.5 V at this instance. With the solid state relay switch 112 again being in an ON state the voltage Vcap will slowly decrease over time as the power control circuit 120 remains on. Thus, the voltage V1 acts as a switch control voltage to cause the solid state relay switch 112 to alternatively turn ON or OFF, depending upon a value of the voltage V1.

Note that because the voltage on the load V0 may rapidly charge the capacitor C0 while the solid state relay switch 112 is off, and because the solid state relay switch is automatically turned off as soon as the Vcap meets a threshold value, the automatic cycling of the solid state relay switch 112 may be such that the OFF state duration is much less than the ON state duration. In sum, the solid state relay control circuit 132, by providing a hysteresis between a first threshold voltage and a second threshold voltage, the solid state relay switch 112 is automatically maintained in an OFF state for a suitable duration.

Figure 1C:
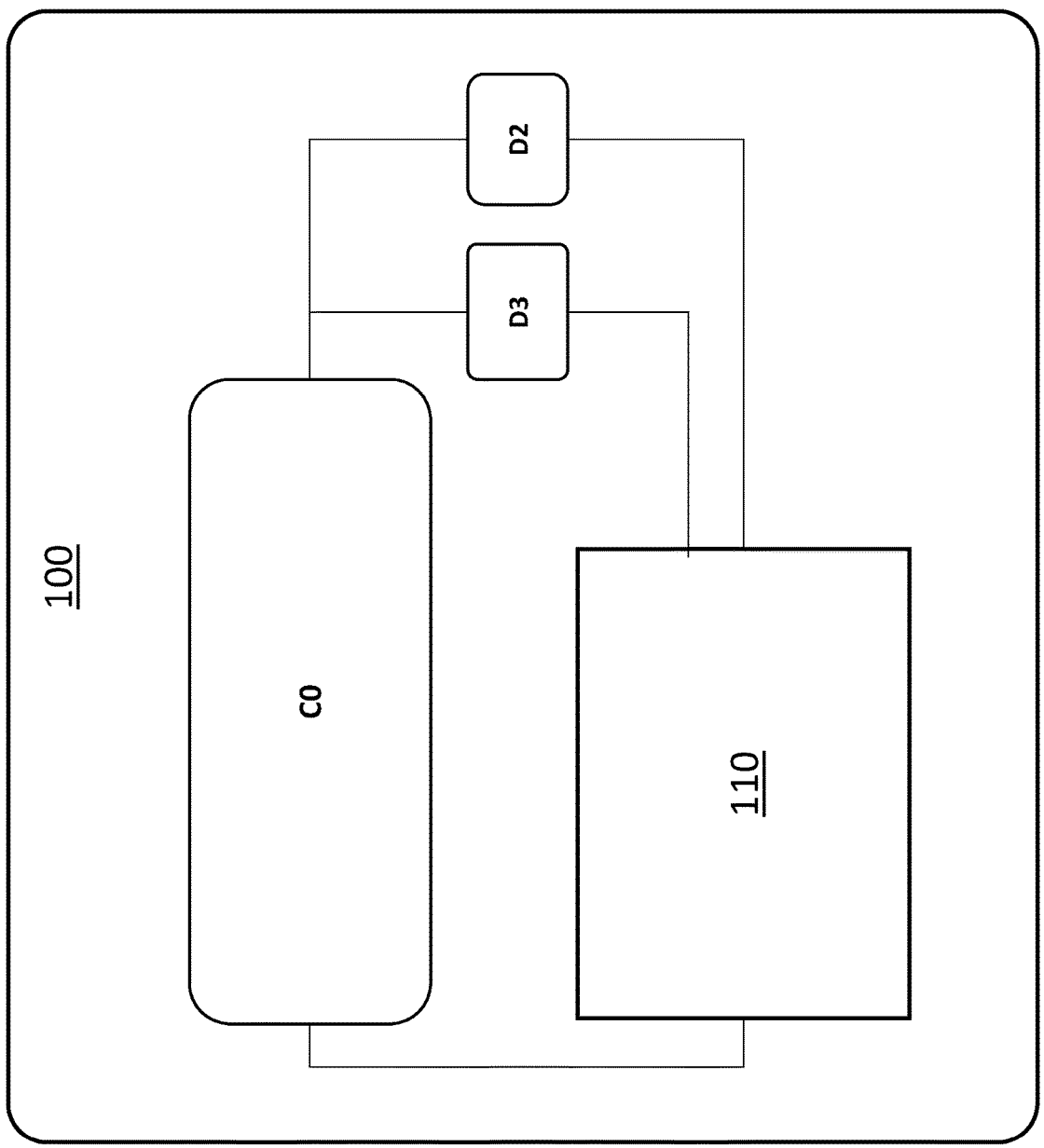
FIG. 1C illustrates a top view of an embodiment of the power control circuit of FIG. 1A or FIG. 1B.

FIG. 1C illustrates a top view of an embodiment of the power control circuit of FIG. 1A or FIG. 1B. In this example, the solid state relay circuit 110 is arranged in a semiconductor die, while the charging capacitor C0, the diode D2 and the diode D3 are disposed externally to the semiconductor die.

Figure 1D:
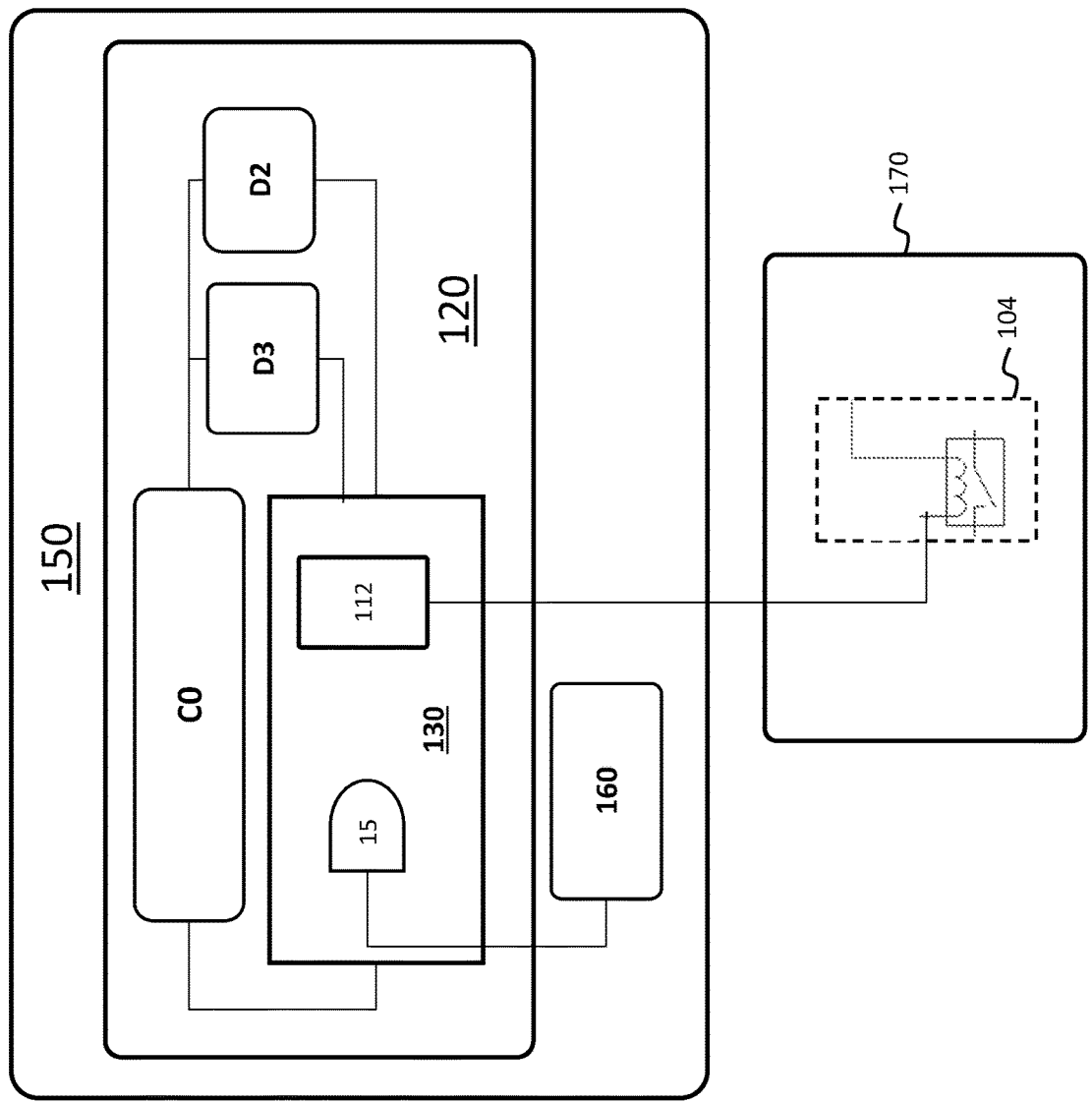
FIG. 1D illustrates one use scenario for the embodiment of the power control circuit of FIG. 1A or FIG. 1B.

FIG. 1D illustrates one use scenario for the power control circuit of FIG. 1A or FIG. 1B. In this example, a thermostat device 150 is shown, where the thermostat device 150 is arranged to control operation of a utility device 170, such as a furnace unit or air conditioning unit. The relay 104 may be located within the utility device 170, to switch, for example, AC power from an AC source (not shown) on and off through the utility device 170. The thermostat device 150 further includes a sensor 160, coupled to alternately provide an enable HIGH signal or an enable LOW signal to the AND logic gate 15, described previously, depending upon the ambient temperature detected.

Figure 2:
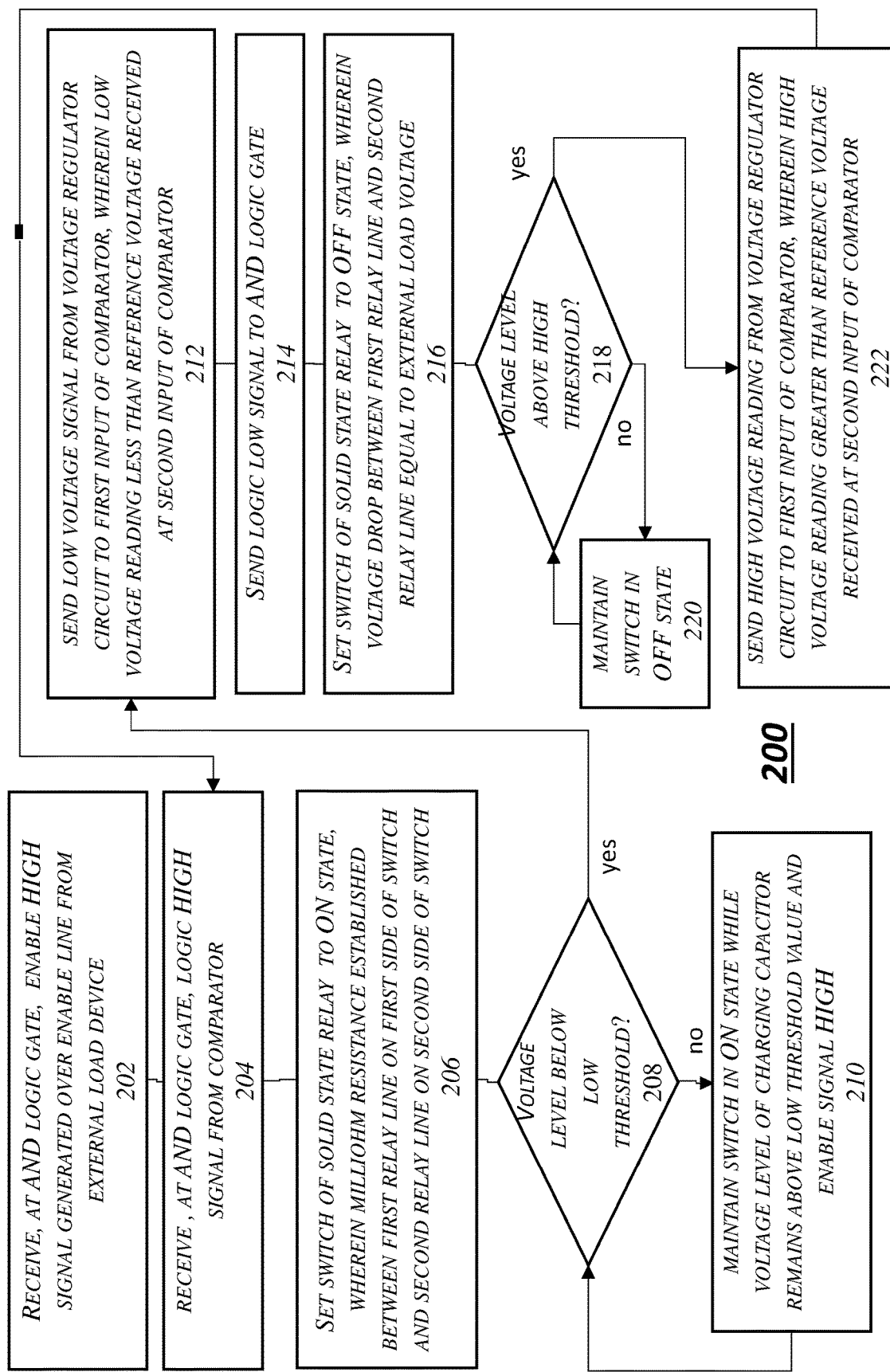
FIG. 2 illustrates an embodiment of a process flow.

FIG. 2 illustrates an embodiment of a process flow 200. At block 202, FIG. 2 illustrates an embodiment of a process flow 200. At block 202, an enable HIGH signal that is generated over an enable line from an external device is received at a power control circuit. The enable HIGH signal may be received, for example, at a gate, such as an AND logic gate of a control circuit for controlling operation of a solid state relay switch in a solid state relay circuit.

At block 204, a HIGH signal is received from a comparator at the AND logic gate. The HIGH signal may be generated based upon the condition of a charging capacitor that powers the solid state relay circuit. For example, the HIGH signal may be generated when the voltage level of the charging capacitor is above a high threshold value, as determined by a voltage divider circuit.

At block 206, the solid state relay switch is set to an ON state, where a milliohm- level resistance is established between a first relay line on a first side of the solid state switch and a second relay line on a second side of the solid state relay switch. In particular the solid state relay switch is toggled to an ON state from a logic high signal generated by the AND logic gate, responsive to receipt of the HIGH signal generated by the comparator and the enable HIGH signal received from the external device.

At decision block 208, a determination is made as to whether the voltage level of the charging capacitor is below the low threshold. In one example, this determination is made by the voltage divider circuit, which circuit is coupled to the comparator. For example, while the voltage level is above the low threshold, the voltage divider circuit may output a voltage to the comparator that is above a reference voltage, thus maintaining the output of the comparator to an AND logic gate high. If, at decision block 208, the voltage level of the charging capacitor has not fallen below the low threshold, the flow proceeds to block 210, where the solid state relay switch is maintained in the ON state as long as the voltage level of charging capacitor remains above the low threshold value and the ENABE signal remains high. The flow then returns to decision block 208.

If, at block 210, the voltage level of the charging capacitor is below the low threshold value, the flow moves to block 212. At block 212, a low voltage reading is sent from a voltage divider circuit to a first input of the comparator, where the low voltage reading is less than the reference voltage received at second input of comparator.

The flow then proceeds to block 214, where a logic low signal is sent to the AND logic gate. The flow then moves to block 216 where the switch of the solid state relay is set to the OFF state. As such, the two ends of the switch may be electrically isolated from one another such that voltage drop between the first relay line and the second relay line is equal to the external load voltage. At this juncture, the charging capacitor will be charged via the voltage across the first relay line and second relay line, so that the voltage level of the charging capacitor will rapidly rise.

The flow then proceeds to decision block 218, where the voltage level of the charging capacitor may be measured and a determination is made as to whether the voltage level has risen above a high threshold value. Note that according to various embodiments of the disclosure, the high threshold level may be set considerably higher than the low threshold level. For example, a suitable low threshold value may be 10 V, while a suitable high threshold value may be 20 V.

If, at decision block 218, the voltage level has not exceeded the high threshold value, the flow moves to block 220, where the switch is maintained in the OFF state, allowing the charging capacitor to continue to receive charging voltage from the external load. If at block 220, the voltage level has exceeded the high threshold value, the flow moves to block 222.

At block 222, a high voltage reading is sent from the voltage regulator circuit to the first input of the comparator, wherein the high voltage reading is greater than the reference voltage received at the second input of the comparator. The comparator may then output a logic HIGH signal to the AND logic gate. The flow then returns to block 204.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A relay circuit, comprising:
   a solid state relay switch, coupled to an external voltage line and to a charging capacitor;

a solid state relay control circuit, coupled between the charging capacitor and the solid state relay switch, the solid state relay control circuit arranged to:

turn the solid state relay switch to an OFF state when a capacitor voltage of the charging capacitor falls below a low threshold value; and change the solid state relay switch from the OFF state to an ON state when the capacitor voltage increases above a high threshold value;

the solid state relay control circuit comprising:
 a voltage divider circuit, coupled to receive the capacitor voltage of the charging capacitor; and
 a comparator to output a logic signal in a HIGH or LOW state based upon a level of a voltage signal received from the voltage divider circuit;

the voltage divider circuit comprising:
 a first control switch, coupled to a first voltage stage of the voltage divider circuit:
 a second control switch, coupled to a second voltage stage of the voltage divider circuit;
 a control voltage line, coupled between the first control switch, the second control switch, and a first input to the comparator; and
 a reference voltage source coupled to output a reference voltage to a second input of the comparator; and
 an AND gate, having a first input coupled to an output of the comparator, and a second input coupled to receive an ENABLE signal.

2. The relay circuit of claim 1, wherein the solid state relay switch comprises a pair of transistors, wherein a first transistor gate of a first transistor of the solid state relay switch, and a second transistor gate of a second transistor of the solid state relay switch are coupled to an output of the AND gate.

3. The relay circuit of claim 2, wherein the first control switch of the voltage divider circuit comprises a third transistor, and the second control switch of the voltage divider circuit comprises a fourth transistor.

4. The relay circuit of claim 3 wherein the output of the AND gate is directly coupled to a first gate of the first transistor, wherein the solid state relay control circuit further comprises an inverter, coupled between the output of the comparator and a second gate of the second control switch.

5. A method, comprising:
 coupling a first end and a second end of a solid state relay switch to a charging capacitor, via a first diode and a second diode, respectively;
 receiving at the solid state relay switch, an ON control signal based upon an enable HIGH signal generated over an enable line from an external load device;
 maintaining the solid state relay switch in an ON state when a switch control voltage is above a preset value,
 the switch control voltage being derived from a low threshold for a capacitor voltage of the charging capacitor; and
 maintaining the solid state relay switch in an OFF state when the switch control voltage is below the low threshold;
 wherein the solid state relay switch comprises a first transistor and a second transistor, wherein when an enable LOW signal is received over the enable line, the first transistor and the second transistor are maintained in an OFF state, and wherein the charging capacitor is coupled to receive a charging voltage from the external load device;
 wherein during the ON state, a capacitor voltage at the charging capacitor decreases over time, wherein at a second instance during the ON state, the capacitor voltage drops below the low threshold value;
 wherein the switch control voltage is received from a voltage divider circuit coupled to the charging capacitor, wherein the switch control voltage is fed to a first input of a comparator, and wherein a reference voltage having a voltage level at a preset value, based upon the capacitor voltage, is fed to a second input of the comparator; and
 wherein the solid state relay switch is disposed in a solid state relay circuit that further comprises an AND gate, having a first input coupled to an output of the comparator, and having a second input coupled to the enable line, and wherein at the second instance, an output of the comparator switches to logic LOW, wherein the solid state relay switch is changed to the OFF state.

6. The method of claim 5, wherein, at a first instance, when the enable HIGH signal is received and a logic HIGH signal is received, the first transistor and the second transistor are switched to an ON state.

7. The method of claim 6 wherein, in the ON state, a voltage drop between a first relay line, connected to a first side of the solid state relay switch, and a second relay line, connected to a second side of the solid state relay switch is smaller than a voltage required to operate the solid state relay switch.

8. The method of claim 5, wherein during the OFF state, when the charging capacitor is charged to above a high threshold value, the voltage divider circuit outputs the switch control voltage at a level that exceeds the preset value of the reference voltage, wherein an output of the comparator switches to logic HIGH, and wherein the solid state relay switch is changed to the ON state.

* * * * *